(12) United States Patent
Haralabidis et al.

(10) Patent No.: US 9,560,609 B2
(45) Date of Patent: Jan. 31, 2017

(54) METHOD FOR SUPPRESSION OF SPURS FROM A FREE RUNNING OSCILLATOR IN FREQUENCY DIVISION DUPLEX (FDD) AND TIME DIVISION DUPLEX (TDD) WIRELESS SYSTEMS

(71) Applicant: Broadcom Corporation, Irvine, CA (US)

(72) Inventors: Nikolaos Haralabidis, Athens (GR); Ioannis Kokolakis, Cholargos (GR); Georgios Konstantopoulos, Nea Pendeli (GR)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/755,199

(22) Filed: Jun. 30, 2015

(65) Prior Publication Data

US 2015/0319721 A1 Nov. 5, 2015

Related U.S. Application Data

(62) Division of application No. 13/435,573, filed on Mar. 30, 2012, now Pat. No. 9,086,437.

(Continued)

(30) Foreign Application Priority Data

Mar. 26, 2012 (GR) .................................. 120100176

(51) Int. Cl.
*H04B 1/06* (2006.01)
*H04B 7/00* (2006.01)
(Continued)

(52) U.S. Cl.
CPC .............. *H04W 52/52* (2013.01); *G01R 23/02* (2013.01); *H03L 7/06* (2013.01); *H03L 7/085* (2013.01);
(Continued)

(58) Field of Classification Search
CPC ........... H04B 1/0475; H04B 1/10; H03L 7/06; H03L 7/08; H03L 7/085; H03L 7/093; H03L 7/1974; H04W 52/52
See application file for complete search history.

(56) References Cited

U.S. PATENT DOCUMENTS

| 6,137,852 A | 10/2000 | McGinn et al. |
| 2002/0033714 A1 | 3/2002 | Perrott |

(Continued)

*Primary Examiner* — Nguyen Vo
(74) *Attorney, Agent, or Firm* — Sterne, Kessler, Goldstein & Fox PLLC

(57) ABSTRACT

Embodiments of this disclosure include methods in which spurs generated by the drifting of an oscillation frequency of an oscillation signal provided by a free-running oscillator may be minimized and/or eliminated from an output signal of a phase locked loop (PLL). Methods include minimizing the mixing gain between the oscillation signal and a power signal provided to the PLL. The oscillation signal and the power signal may be mixed in a phase frequency detector (PFD) included in the PLL. The minimizing of the mixing gain for the PFD also minimizes the degrading effect that the spurs have on the overall performance of the communications device. The mixing gain may be minimized by minimizing the impedance provided at nodes included in the PFD where the oscillation signal and the power signal mix. The mixing gain may also be minimized by maximizing the power supply rejection ratio for the PFD.

20 Claims, 4 Drawing Sheets

Related U.S. Application Data

(60) Provisional application No. 61/556,094, filed on Nov. 4, 2011.

(51) Int. Cl.
| | |
|---|---|
| *H04W 52/52* | (2009.01) |
| *H03L 7/06* | (2006.01) |
| *H04W 72/04* | (2009.01) |
| *H04L 5/14* | (2006.01) |
| *G01R 23/02* | (2006.01) |
| *H03L 7/085* | (2006.01) |
| *H03L 7/197* | (2006.01) |
| *H04W 88/02* | (2009.01) |

(52) U.S. Cl.
CPC ............. *H03L 7/1974* (2013.01); *H04L 5/14* (2013.01); *H04W 72/0453* (2013.01); *H04W 88/02* (2013.01)

(56) References Cited

U.S. PATENT DOCUMENTS

| | | | |
|---|---|---|---|
| 2006/0208804 A1* | 9/2006 | Kuo | H03L 7/085 331/16 |
| 2007/0160164 A1* | 7/2007 | Sahota | H03C 5/00 375/295 |
| 2011/0204937 A1* | 8/2011 | Demirkan | H03L 7/087 327/157 |

* cited by examiner

METHOD FOR SUPPRESSION OF SPURS FROM A FREE RUNNING OSCILLATOR IN FREQUENCY DIVISION DUPLEX (FDD) AND TIME DIVISION DUPLEX (TDD) WIRELESS SYSTEMS

CROSS-REFERENCE TO RELATED APPLICATIONS

The present application is a divisional of U.S. Non-Provisional patent application Ser. No. 13/435,573, filed on Mar. 30, 2012, which claims the benefit of U.S. Provisional Patent Appl. No. 61/556,094, filed Nov. 4, 2011 and Greek Patent Appl. No.: 20120100176, filed Mar. 26, 2012. The contents of application Ser. No. 13/435,573 and Appl. No. 61/556,094 are incorporated herein by reference in their entirety.

BACKGROUND

Field of Disclosure

The present disclosure relates generally to a phase locked loop (PLL) and specifically to spur suppression in a free running oscillator for the cellular phone.

Related Art

Cellular phones have evolved from large devices that were only capable of analog voice communications to comparatively smaller devices that are capable of digital voice communications and digital data communications, such as Short Message Service (SMS) for text messaging, email, packet switching for access to the Internet, gaming, Bluetooth, and Multimedia Messaging Service (MMS) to provide some examples. In addition to these capabilities, the cellular phones of today have additional non-communication related capabilities, such as a camera with video recording, an MPEG-1 Audio Layer 3 (MP3) player, and software applications such as a calendar and a phone book, to provide some examples. Even in light of these capabilities, manufacturers of cellular phones are placing even more capabilities into cellular phones and making these more powerful cellular phones smaller.

At the heart of each cellular phone lies a phase locked-loop (PLL) to generate various electronic signals within the cellular phone. For example, the PLL is responsible for providing various clocking signals within the cellular phone. As another example, the PLL is responsible for providing various electronic signals for transmission and/or reception of data. Some cellular phones also include a free running oscillator, such as a crystal for example, that is external to the PLL. The free running oscillator provides an oscillation signal having an oscillation frequency to the input of the PLL. The oscillation frequency is not fixed, rather, the oscillation frequency may vary or drift over various conditions, such as temperature or time to provide some examples.

Conventionally, the oscillation signal, or an integer or fractional multiple of, may be used as a reference signal by the PLL. The PLL adjusts its output such that its output is related, in either frequency and/or phase, to the oscillation signal. However, as the oscillation signal provided drifts, so does the output of the PLL. This drifting may generate spurs that degrade the performance of the cellular phone.

BRIEF DESCRIPTION OF THE DRAWINGS/FIGURES

Embodiments of the present disclosure are described with reference to the accompanying drawings. In the drawings, like reference numbers indicate identical or functionally similar elements. Additionally, the left most digit(s) of a reference number identifies the drawing in which the reference number first appears.

Figure 1:
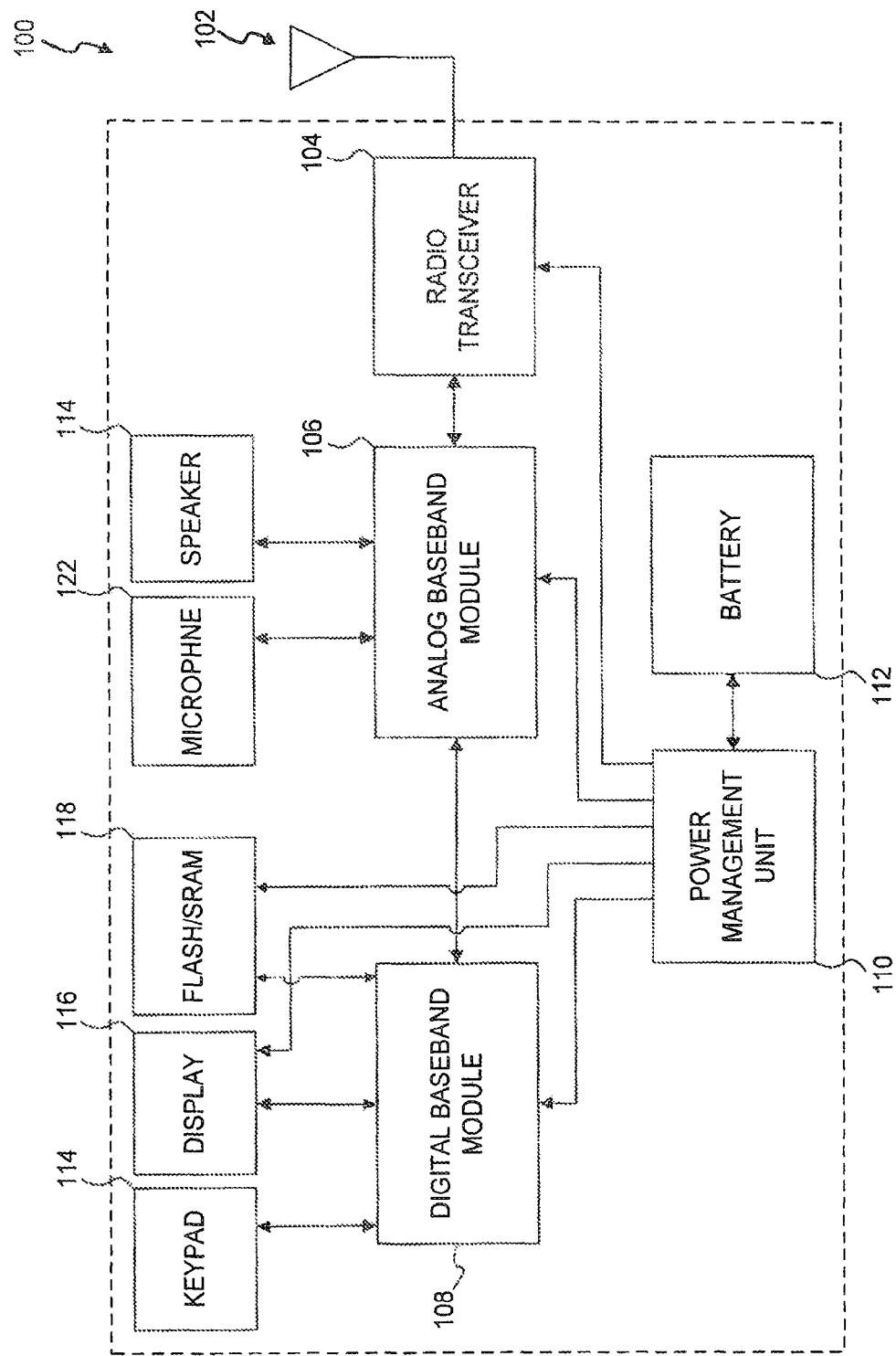
FIG. 1 illustrates a block diagram of a communications device according to an exemplary embodiment of the present disclosure.

The present disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE PRESENT DISCLOSURE

The following Detailed Description refers to accompanying drawings to illustrate exemplary embodiments consistent with the present disclosure. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the present disclosure. Therefore, the Detailed Description is not meant to limit the present disclosure. Rather, the scope of the present disclosure is defined only in accordance with the following claims and their equivalents.

Embodiments of the present disclosure may be implemented in hardware, firmware, software, or any combination thereof. Embodiments of the present disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

For purposes of this discussion, each of the various components discussed may be considered a module, and the term "module" shall be understood to include at least one of software, firmware, and hardware (such as one or more circuit, microchip, or device, or any combination thereof), and any combination thereof. In addition, it will be understood that each module may include one, or more than one, component within an actual device, and each component that forms a part of the described module may function either cooperatively or independently of any other component forming a part of the module. Conversely, multiple modules described herein may represent a single component within an actual device. Further, components within a module may be in a single device or distributed among multiple devices in a wired or wireless manner.

The following Detailed Description of the exemplary embodiments will so fully reveal the general nature of the present disclosure that others can, by applying knowledge of those skilled in relevant art(s), readily modify and/or adapt for various applications such exemplary embodiments, without undue experimentation, without departing from the spirit and scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

An Exemplary Communications Device

FIG. 1 illustrates a block diagram of a communications device according, to an exemplary embodiment of the present disclosure. A communications 100 represents a communications device used for voice or data communications from a near-end user to a far-end user over a cellular network. The communications device 100 may communicate with one or more fixed location transceivers, referred to as cell sites, within the cellular network. The cell sites are connected to a cellular telephone exchange that connects to a public telephone network or to another cellular telephone exchange within the cellular network allowing the near-end user to communicate, via the communications device 100, with the far-end user.

The communications device 100 includes an antenna 102, a radio transceiver 104. an analog baseband module 106, a digital baseband module 108, a power management unit (PMU) 110, and a battery 112. The antenna 102 captures a received voice or data communication from the one or more fixed location transceivers and/or provides a transmitted voice or data communication from the radio transceiver 104 to the one or more fixed location transceivers.

The radio transceiver 104 may include one or more amplifiers, such as one or more low noise amplifiers (LNAs) and/or one or more low noise block converters (LNBs) to provide some examples, to amplify the received voice or data communication after it has been captured by the antenna 102 and/or to amplify the transmitted voice or data communication prior to being provided to the one or more fixed location transceivers. The radio transceiver 104 may additionally include one or more filters to filter the received voice or data communication and/or the transmitted voice or data communication, respectively. The radio transceiver 104 may further include one or more mixers to downconvert the received voice or data communication after it has been captured by the antenna 102 and/or to upconvert the transmitted voice or data communication prior to being provided to the one or more fixed location transceivers. The radio transceiver 104 may yet further include a diplexer or switch to separate the received voice or data communication captured from the one or more fixed location transceivers and the transmitted voice or data communication to be provided to the one or more fixed location transceivers.

The analog baseband module 106 performs typical analog signal processing upon the received voice or data communication and/or the transmitted voice or data communication. For example, the analog baseband module 106 may include a channel encoder to encode the transmitted voice or data communication and/or a channel decoder to decode the received voice or data communication according to one or more linear block codes and/or one or more convolutional codes. The analog baseband module 106 may additionally include one or more multiplexers to multiplex a voice communication received from a microphone 122 with a data communication received from the digital baseband processing module 108 and/or one or more demultiplexers to separate the received voice or data communication to provide a voice communication to a speaker 124 and a data communication to the digital baseband processing module 108. The analog baseband module 106 may further include one or more speech encoders to encode the voice communication received from the microphone 122 and/or one or more speech decoders to decode the voice communication provided to the speaker 124. The analog baseband module 106 may yet further include one or more analog to digital converters to convert the data communication to be provided to the digital baseband processing module 108 to a digital representation and/or one or more digital to analog converters to convert the data communication from the digital baseband processing module 108 to an analog representation.

The digital baseband processing module 108 performs typical digital signal processing upon the data communication provided by the analog baseband module 106 and/or the data communication to be provided to the analog baseband module 106. The digital baseband processing module 108 may include one or more processors to load one or more software applications from the flash/SRAM 118. The one or more software applications may operate upon the data communication provided by the analog baseband module 106 to provide a graphical output to a display 116. A keypad 114 may provide a numerical input, such as a telephone number of the far-end user, a text message for a Short Message Service (SMS) application, an electronic mail message destined for the near-end user, or any other suitable application to be performed by the near-end user to provide some examples, to the digital baseband processing module 108. The one or more software applications may operate on this numerical input to provide the data communication for the analog baseband module 106. The one or more software applications, such as electronic games to provide an example, may operate upon the numerical input from the keypad 114 to provide the graphical output to the display 116 and/or voice data for the analog baseband module 106 for the speaker 124. The digital baseband processing module 108 may further store the numerical input from the keypad 114, the graphical output to the display 116, and/or the data communication provided by the analog baseband module 106 into the flash/ SRAM 118.

The PMU 110 is responsible for monitoring power connections and battery charges. charging batteries when necessary, and controlling power to other integrated circuits, as well other power functions of the cellular phone. For example, the PMU 110 converts a first voltage received from a battery 112, and/or any other suitable source, to one or more second voltages to be used by the cellular phone 100. The PMLJ may additionally include one or more battery chargers to charge the battery 112 from an external alternating current (AC) and/or direct current (DC) source. The PMU may further communicate a status of the battery 112 to the digital baseband processing module 108.

The battery 112 may include one or more nickel-cadmium (NiCd), one or more nickel metal hydride (NIMH), and/or one or more lithium-ion (Li-ion) cells. However, this example is not limiting, those skilled in the relevant art(s) may implement the battery 112 using other battery chemistries without departing from the scope and spirit of the present disclosure. The one or more cells of the battery 112 convert chemical energy into electrical energy via an electrochemical reaction.

The cellular phone 100 may include one or more phase lock loops (PLLs) to generate various signals for the radio transceiver 104, the analog baseband module 106, the digital baseband module 108, and/or the PMU 110. For example, the one or more PLLs may be used to generate an analog signal, a digital signal, a data signal, and/or a clocking signal for the radio transceiver 104, the analog baseband module 106, the digital baseband module 108, and/or the PMU 110. However, these examples are not limiting, those skilled in the relevant art(s) will recognize that other electronic signals may be generated by the one or more PLLs without departing from the spirit and scope of the present disclosure.

One or more components of the cellular phone 100, such as, but not limited to, the radio transceiver 104, the analog baseband module 106, the digital baseband module 108, and/or the PMU 110 to provide some examples, may be implemented on a semiconductor chip or die. For example, the digital baseband module 108 and the PMU 110 may be implemented on a semiconductor chip or die. Alternatively, the one or more components of the cellular phone 100 may be each implemented on a single chip or die. For example, the radio transceiver 104, the analog baseband module 106, the digital baseband module 108, and/or the PMU 110 may each be implemented on a single chip or die.

A Conventional Phase Locked Loop (PLL)

Figure 2:
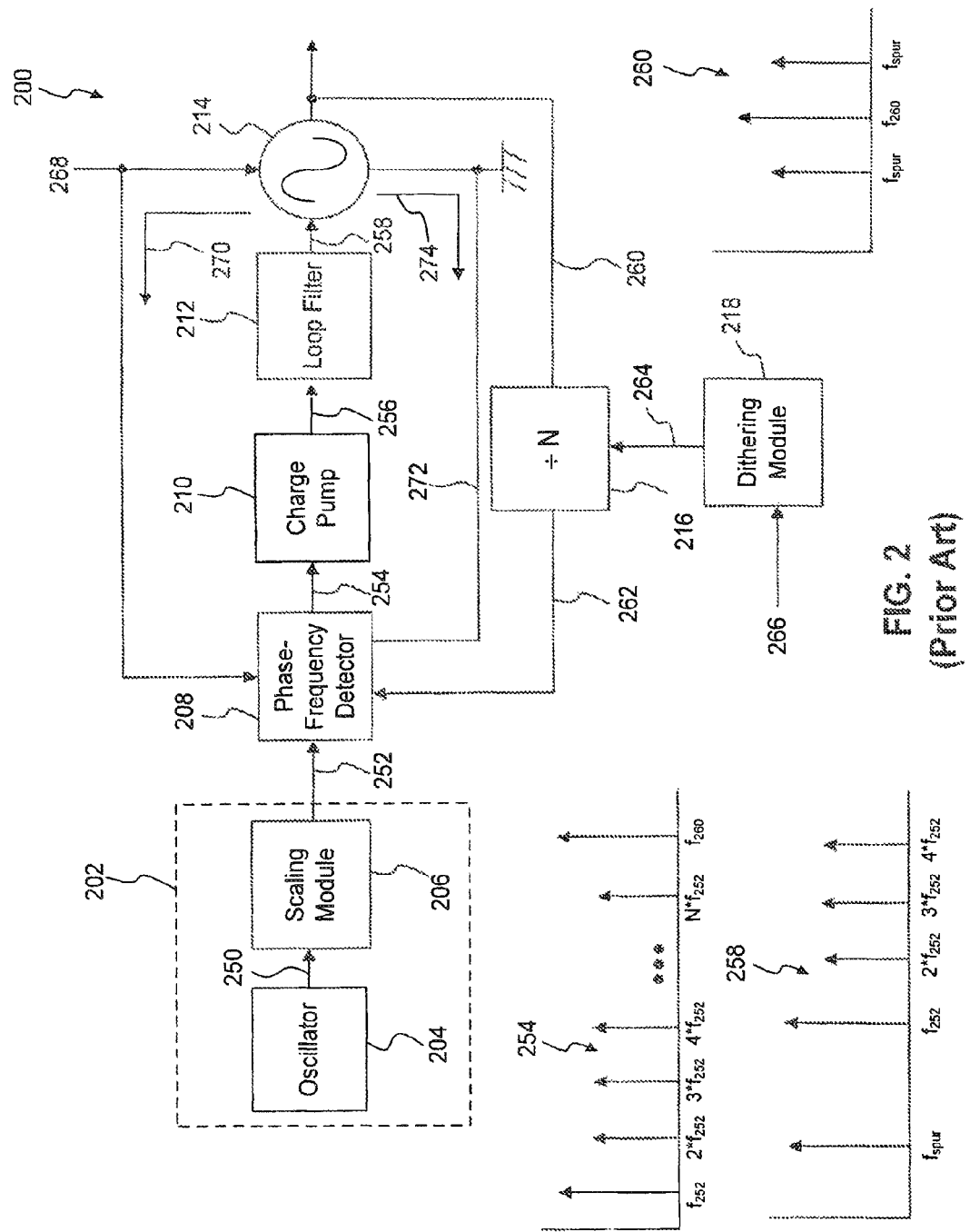
FIG. 2 is a block diagram of a conventional reference PLL that is used in a conventional communications device.

FIG. 2 is a block diagram of a conventional reference PLL that is used in a conventional communications device. A conventional reference PLL 200 represents a closed-loop feedback control system that generates a target signal 260 in relation to a frequency and a phase of reference signal 252. In other words, the conventional reference PLL 200 performs frequency multiplication and/or division, via a negative feedback mechanism, to generate the target signal 260 in terms of the reference signal 252. The conventional reference PLL 200 may be implemented using a conventional reference oscillator, conventional phase/frequency detector (PFD) 208, a charge pump 210, a loop filter 212, a voltage controlled oscillator (VCO) 214, an optional integer frequency divider 216, and an optional dithering module 218.

The conventional reference oscillator 202 provides the reference signal 252 to the conventional PFD 208. The reference signal 252 is related to a desired operating frequency of the conventional reference PLL 200. For example, a frequency of the reference signal 252 may be approximately equal or an integer or fractional multiple of the desired operating frequency of the conventional reference PLL 200. The conventional reference oscillator 202 includes a conventional oscillator 204 and a conventional optional scaling module 206. The conventional oscillator 204 provides a reference signal 250. The conventional optional scaling module 206 multiplies and/or divides the reference signal 250 to generate the reference signal 252.

The conventional oscillator 204 can be characterized as being a free-running external oscillator. The conventional oscillator 204 provides the reference signal 250 that is characterized as having a frequency that is not fixed. Rather, the frequency of the reference signal 250 may vary or drift due to conditions within the conventional reference PLL 200 or elsewhere within the conventional reference PLL 200. For example, the frequency and/or phase of the reference signal 250 may drift when the temperature increases and/or decreases over time in the conventional reference PLL 200.

The conventional PFD 208 converts a difference between the frequency and/or the phase of the reference signal 252 and a phase and/or a frequency of a divided feedback signal 262 into an error signal 254. Specifically, the conventional PFD 208 produces the error signal 254 by comparing the frequency and/or the phase of the divided feedback signal 262 and the frequency and/or the phase of the reference signal 252 to detect for deviations between the reference signal 252 and the divided feedback signal 262. When the phase and the frequency of the error signal 254 and the phase and the frequency of the divided feedback signal 262 are substantially equivalent, the conventional reference PLL 200 is in the locked condition. In the locked condition, the error signal 254 is proportional to the phase difference between the reference signal 252 and the divided feedback signal 262.

The charge pump 210 converts the error signal 254 to a voltage/current domain representation, denoted as a charge pump output 256, to control a frequency of the VCO 214, When the conventional reference PLL 200 is in the unlocked condition, the charge pump 210 increases or decreases the charge pump output 256 based on the error signal 254. When the conventional reference PLL 200 is in the locked condition the error signal 254 is minimized and the charge pump 210 maintains the charge pump output 256 at a substantially fixed value.

The loop filter 212 may be used to remove undesirable noise from the charge pump output 256 to generate a tuning signal 258. The loop filter 212 may be implemented as a low pass filter to suppress high frequency components in the charge pump output 256 to allow a direct current (DC), or near DC, component of the charge pump output 256 to control the VCO 214. The loop filter 212 also maintains stability of the conventional reference PLL 200.

The VCO 214 is a voltage to frequency converter. Specifically, the VCO 214 produces the target signal 260 based upon the tuning signal 258. The tuning signal 258 is used to further adjust the target signal 260 until it is approximately equal to an integer or fractional multiple of the reference signal 252.

The optional integer frequency divider 216 is located in a feedback path of the conventional reference PLL 200. The optional integer frequency divider 216 divides the target signal 260 by an integer N to provide the divided feedback signal 262.

The optional dithering module 218 allows the conventional reference PLL 200 to dither the divide value over time between two or more integer values to obtain an effective time averaged fractional division factor. More specifically, the optional dithering module 218 selects between the two or more integer values for each iteration of the conventional reference PLL 200 in response to a division code 264, so that on average, a fractional division factor can be represented. The optional dithering module 212 generates the division code 260 in response to the divide ratio control signal 266.

Typically, imperfections within the conventional reference PLL 200 may cause unwanted electromagnetic energy, commonly referred to as frequency spurs or simply spurs, to be coupled onto the target signal 260. Generally, a frequency of the one or more spurs may be characterized as:

$$\sum_{k=1}^{i*j} f_{spur}[k] = \sum_{M=1}^{i} \sum_{N=1}^{j} [f_{LO} \pm M * (f_{VCO} - N * f_{ref})], \quad (1)$$

where $f_{spur}$ represents a frequency of a $k^{th}$ spur from among the one or more spurs, $f_{LO}$ represents a frequency of a desired output of the conventional reference PLL 200, $f_{VCO}$ represents a frequency of the target signal 260, and $f_{ref}$ represents a frequency of the reference signal 252. Typically, the reference signal 252 can be characterized as including a fundamental frequency and one or more integer multiples, referred to as harmonics, of the fundamental frequency. The integer N ranges from 1 to j which corresponds to integer multiples of the fundamental frequency that are present within the reference signal 252, where N=1 corresponds to the fundamental frequency, N=2 corresponds to a second harmonic of the fundamental frequency, etc. Typically, a value for the integer N that minimizes ($f_{VCO}-N*f_{ref}$) is the most problematic within the conventional reference PLL 200. The one or more spurs are typically evenly spaced, in frequency, from the frequency of the desired output of the conventional reference PLL 200. The integer M ranges from 1 to i which corresponds an order of the spurs that are present within the target signal 260, where M=1 corresponds to a first order spur, M=2 corresponds to a second order spur, etc.

Ideally, a frequency of the target signal 260 is characterized as having the fundamental frequency $f_0$ that is sufficiently proportional to the frequency of the reference signal 252. However, in practice, the conventional oscillator 204 may drift from its theoretical value based upon a drift parameter $\epsilon$. This drifting may cause the frequency of the target signal 260 to be:

$$f_{260}=(N\pm\epsilon)*f_{252}, \quad (2)$$

where $f_{260}$ represents the frequency of the target signal 260, $f_{252}$ represents a frequency of the reference signal 252, N represents an integer multiple of the fundamental frequency of the reference signal 252, and $\epsilon$ represents the drift parameter of the conventional oscillator 204.

Typically, a control voltage is coupled onto the tuning signal 258 to, in essence, stabilize the target signal 260 to a fixed frequency. The target signal 260 is divided by the optional integer frequency divider 216 to provide the divided feedback signal 262. Similarly, the divided feedback signal 262 can be characterized as having an essentially fixed frequency. Ideally, the frequency of the reference signal 252 is approximately equal to the frequency of the divided feedback signal 262. However, the drifting of the conventional oscillator 204 may cause an actual frequency of reference signal 252 to differ from its theoretical or expected value.

In this non-ideal situation, the output of the conventional PFD 208 includes one or more spurious components at various multiples of the reference signal 252 plus various intermodulation products between the above frequency component and the divided feedback signal 262. For example as shown regarding the conventional PFD 208, $f_{252}$ represents the frequency of the reference signal 252. Each of $2*f_{252}$, $3*f_{252}$, $4*f_{252}$, and $N*f_{252}$ represent each harmonic frequency of the reference signal 252. Ideally, the frequency $N*f_{252}$ of the Nth harmonic of the reference signal 252 is approximately equal to the frequency $f_{260}$ of the target signal 260. However, the drifting of the conventional oscillator 204 causes the frequency $N*f_{252}$ to differ from the frequency $f_{260}$ of the target signal 260.

The conventional PFD 208 mixes the Nth harmonic of the reference frequency 252 with the target signal 260 to generate spurious components with a frequency $f_{spur}$. The frequency $f_{spur}$ of the spurious components may or may not be within the PLL bandwidth. For example as shown regarding the tuning signal 258, the spurious components that include the frequency $f_{spur}$ are coupled onto the tuning signal 258. Further attenuation of $f_{spur}$ is expected if it lies outside the PLL bandwidth due to low-pass characteristics of the filtering action on the PLL in-band noise sources. However, the actual frequency $f_{spur}$ cannot be predicted due to the random nature of the free running oscillator frequency drift.

The tuning signal 258 then modulates the VCO 214 onto the target signal 260 thereby degrading performance of the communications device 100. For example as shown regarding the target signal 260, the spurious components couple onto the target signal 260 such that the spurious components appear at a frequency$\pm f_{spur}$ that is offset from frequency $f_{260}$ of the target signal 260.

Additionally, undesirable coupling of various signals within the conventional reference PLL 200 may couple, either directly or indirectly, onto other signals within the conventional reference PLL 200 causing the one or more spurs. For example, the conventional VCO 214 is typically coupled to a common power signal 268 and a common ground connection 272. During operation, the target signal 260 may couple onto the common power signal 268, although attenuated, to provide undesired target signal 270 and/or onto the common ground connection 272, although attenuated, to provide an undesired target signal 274. The coupling path may be either through a common power signal as described above and/or undesirable coupling between different power signals.

As shown in FIG. 2, various modules of the conventional PLL 200, such as the conventional PFD 208, are also coupled to the common power signal 268 and the common ground connection 272. As a result, the undesired target signal 270 and the undesired target signal 274 may be coupled onto various electronic signals, via the common power signal 268 and the common ground connection 272, within these modules causing the one or more spurs. For example, the conventional PFD 208 may represent an active device that is coupled to the common power signal 268 and the common ground connection 272. In this situation, the conventional PFD 208 can undesirably mix the reference signal 252 with the undesired target signal 270 and the undesired target signal 274 causing the one or more spurs.

A First Exemplary Reference PLL

Figure 3:
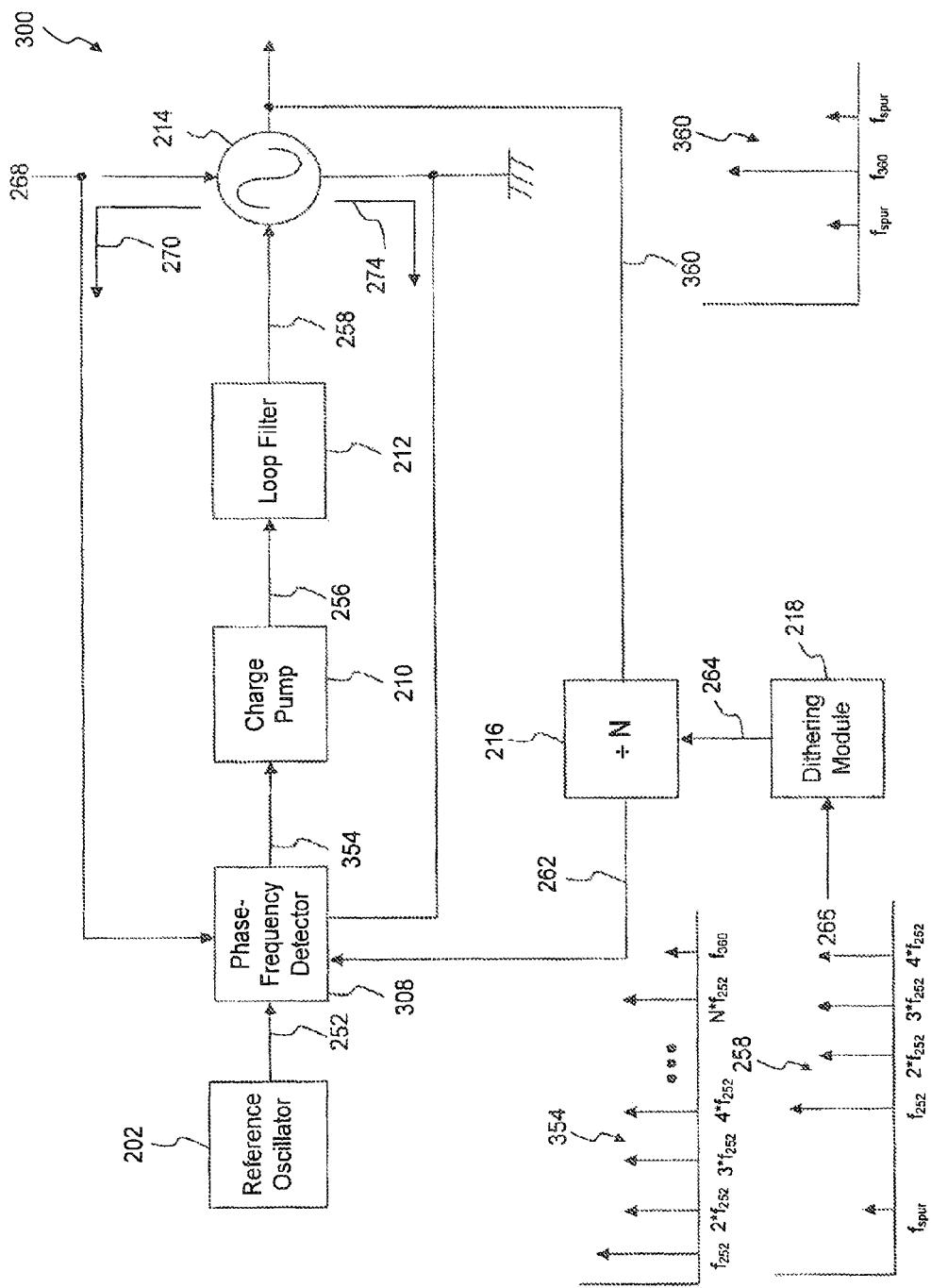
FIG. 3 is a block diagram of a reference PLL that may be used in the communications device according to an exemplary embodiment of the present disclosure.

FIG. 3 is a block diagram of a first reference PLL that may be used in the communications device according to an exemplary embodiment of the present disclosure. A reference PLL 300 substantially compensates for drifting of its reference oscillator and/or coupling of its VCO output onto its various signals to substantially reduce spurs coupled onto its target signal. The reference PLL 300 may be implemented using the PFD 308, the charge pump 210, the loop filter 212, the voltage controlled oscillator (VCO) 214, the optional integer frequency divider 216, and the optional dithering module 218. The reference PLL 300 shares many similar features with the conventional reference PLL 200; therefore, only the differences between the conventional reference PLL 200 and the reference PLL 300 are to be discussed in further detail.

The PFD 308 converts the difference between the frequency and/or the phase of the reference signal 252 and the phase and/or a frequency of the divided feedback signal 262 into an error signal 354. The error signal 354 represents a differential error signal having a first component 354.1 and a second component 354.2. The PFD 308 substantially compensates for drifting of the conventional oscillator 202 by controlling its mixing gain, or conversion factor K. to substantially reduce spurs coupled on to the error signal 354. Typically, by ignoring all harmonics within the reference signal 252 and the divided feedback signal 262, the error signal 354 may be approximated as:

$$s_{354}(t)=K^*s_{252}(t)^*s_{262}(t), \qquad (3)$$

wherein $s_{354}(t)$ represents the error signal 354, $s_{252}(t)$ represents the reference signal 252, $s_{262}(t)$, represents the divided feedback signal 262, and K represents a conversion factor of the PFD 308. The conversion factor K of the PFD 308 may be selectively controlled through design, manufacture, and/or fabrication to substantially reduce spurs that may couple onto the error signal 354.

Figure 4:
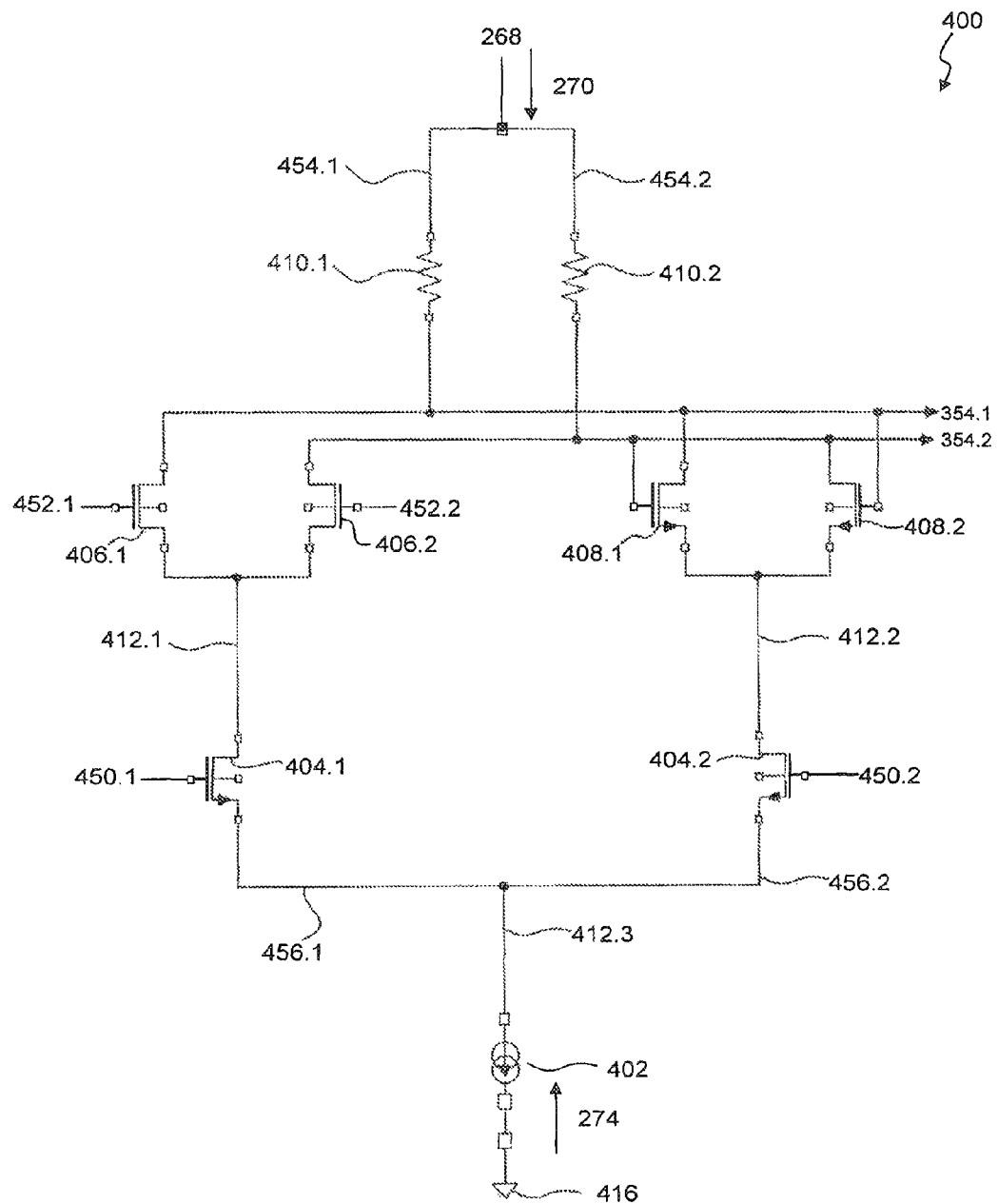
FIG. 4 illustrates a block diagram of an exemplary phase frequency detector (PFD) that may be used in the reference PLL according to an exemplary embodiment of the present disclosure.

Additionally, the PFD 308 may prevent or reject the undesired target signal 270 and/or the undesired target signal 274 from coupling on to the error signal 254. A measure of this rejection of the undesired target signal 270 and/or the undesired target signal 274 is typically quantified as a power supply rejection ratio (PSRR). The PFD 308 maximizes its PSRR by substantially matching various signal paths of the first component 354.1 and the second component 354.2 of error signal 354. For example, as shown in FIG. 4 and discussed in more detail below, PFD 400 may represent an exemplary embodiment of the PFD 308. The active devices within a first signal path of the PFD 400 corresponding to the first component 354.1 are matched to active devices within a second signal path of the PFD 400 corresponding to the second component 354.2. Typically, the undesired target signal 270 and/or the undesired target signal 274 couple similarly onto the first signal path and the second signal path. As a result, the matching of the first signal path and the second signal path allows the common-mode component, namely the undesired target signal 270 and/or the undesired target signal 274, between the first component 354.1 and the second component 354.2 to be substantially reduced.

In reducing the spurs coupled onto the target signal 360, the output of the PFD 308 includes one or more reduced spurious components at various multiples of a difference between the actual frequency of the reference signal 252 and the divided feedback signal 262. For example as shown regarding the PFD 308, $f_{252}$ represents the frequency of the reference signal 252. Each of $2^*f_{252}$, $3^*f_{252}$, $4^*f_{252}$, and $N^*f_{25}$ represent each harmonic frequency of the reference signal 252. Ideally, the frequency $N^*f_{252}$ of the Nth harmonic of the reference signal 252 is approximately equal to the frequency $f_{360}$ of the target signal 360. However, the drifting of the conventional oscillator 204 causes the frequency $N^*f_{252}$ to differ from the frequency $f_{360}$ of the target signal 360. However, based on controlling the conversion factor K and/or by maximizing the PSRR of the PFD 308 as noted above, the magnitude of the target signal 360 is reduced.

The PFD 308 mixes the Nth harmonic of the reference frequency 252 with the target signal 360 to generate reduced spurious components with a frequency $f_{spur}$. The frequency $f_{spur}$ of the spurious components may or may not be within the bandwidth of loop filter 212. For example as shown regarding the tuning signal 252, the spurious components that include the frequency $f_{spur}$ are within the bandwidth of loop filter 212 and are coupled onto the tuning signal 258.

The tuning signal 258 then modulates the VCO 214 onto the target signal 360. For example as shown regarding the target signal 360, the reduced spurious components couple onto the target signal 360 such that the spurious components appear at a frequency $\pm f_{spur}$ that is offset from frequency $f_{360}$ of the target signal 360. However, the reduced spurious components do not degrade the performance of the communications device 100.

An Exemplary Phase Frequency Detector (PFD)

FIG. 4 illustrates a block diagram of an exemplary phase frequency detector (PFD) that may be used in the reference PLL according to an exemplary embodiment of the present disclosure. A conversion factor K of a PFD 400 may be selectively controlled through design, manufacture, and/or fabrication to substantially reduce spurs that may couple onto its error signal 354. The PFD 400 may represent an exemplary embodiment of the PFD 308.

As shown in FIG. 4, the PFD includes a reference current source 402, a first pair of matched transistors 404, a second pair of matched transistors 406, a third pair of matched transistors 408, and a pair of current sourcing resistors 410. During operation, a first component 450.1 of a reference signal 450 activates a first transistor 404.1 from among the first pair of matched transistors 404 when at a logical one and a second component 450.2 of the reference signal 450 deactivates a second transistor 404.2 from among the first pair of matched transistors 404 when at a logical zero. This is referred as the "evaluating phase" of the operation cycle. The first component 450.1 and the second component 450.2 represent an exemplary embodiment of the reference signal 252.

A first component 452.1 of a feedback signal 452 activates a first transistor 406.1 from among the second pair of matched transistors 406 when at a logical one and a second component 452.2 of the feedback signal 452 deactivates a second transistor 406.2 from among the second pair of matched transistors 406 when at a logical zero. The first component 452.1 and the second component 452.2 represent an exemplary embodiment of the divided feedback signal 262. In this situation, the common power signal 268 is sourced through a first current sourcing resistor 410.1 from among the pair of current sourcing resistors 410 through the first transistor 404.1 and the first transistor 406.1 by the reference current source 402. As a result, the first component 354.1 from among the error signal 354 is at a logical zero and the second component 354.2 from among the error signal 354 is at a logical one.

Similarly, the first component 452.1 deactivates the first transistor 406.1 when at a logical zero and the second component 452.2 activates the second transistor 406.2 when at a logical one. In this situation, the common power signal 268 is sourced through a second current sourcing resistor 410.2 from among the pair of current sourcing resistors 410 through the second transistor 404.2 and the second transistor 406.2 by the reference current source 402. As a result, the first component 354.1 is at a logical one and the second component 354.2 is at a logical zero.

The first component 450.1 deactivates the first transistor 404.1 when at a logical zero and the second component 450.2 activates the second transistor 404.2 when at a logical one. This is referred as the "latching phase" of the operation cycle and it relates to the signals conditions and values acquired during the previous "evaluating phase". During this phase, the signals 354.1 and 354.2 maintain their already acquired value. In this situation, if 354.1 has acquired a logical zero and 354.2 a logical one, the common power signal 268 is sourced through the transistor 408.2 from among the third pair of matched transistors 408 and through the second transistor 404.2 by the reference current source 402. In the opposite situation where 354.2 has acquired a logical zero and 354.1 a logical one, the common power signal 268 is sourced through the transistor 408.1 from among the third pair of matched transistors 408 and through the second transistor 404.2 by the reference current source 402.

As additionally shown in FIG. 4, the PFD 400 includes a first critical node 412.1, a second critical node 412.2, and a third critical node 412.3. Various impedances of these critical nodes may be selectively controlled through design, manufacture, and/or fabrication to control the conversion factor K of the PFD 400. Typically, the conversion factor K may be minimized by minimizing respective impedances, such as capacitances to provide an example, at the critical nodes 412.1 through 412.3. The first pair of matched transistors 404, the second pair of matched transistors 406, and/or the third pair of matched transistors 408 may be selectively designed, manufactured, and/or fabricated to minimize their parasitic capacitances to minimize capacitance at the critical nodes 412.1 through 412.3. For example, a width and/or a length of the first pair of matched transistors 404, the second pair of matched transistors 406, and/or the third pair of matched transistors 408 may be selectively chosen to minimize their parasitic capacitances. Typically, the width and/or the length of these transistors are chosen to be as small as possible as permitted by the semiconductor manufacturing technology.

Additionally, the PFD 400 maximizes its PSRR by substantially matching various signal paths of the first component 354.1 and the second component 354.2. For example, a first signal path having the first current sourcing resistor 410.1 is substantially matched to a second signal path having the second current sourcing resistor 410.2. In this example, matching of the first signal path and the second signal path allows the undesired target signal 270 to substantially equally couple onto these signal paths. As another example, a third signal path having the first signal path, the first transistor 408.1, and the second transistor 404.2 is matched to a fourth signal path having the second signal path, the second transistor 408.2, and the second transistor 404.2. In this example, matching of the third signal path and the fourth signal path allows the undesired target signal 270 to substantially equally couple onto these signal paths. As a further example, a fifth signal path having the first transistor 404.1 and the first transistor 406.1 is matched to a sixth signal path having the first transistor 404.1 and the second transistor 406.2. In this example, matching of the fifth signal path and the sixth signal path allows the undesired target signal 274 to substantially equally couple onto these signal paths. As a yet further example, a seventh signal path having the first transistor 408.1 and the second transistor 404.2 is matched to an eighth signal path having the second transistor 408.2 and the second transistor 404.2. In this example, matching of the seventh signal path and the eighth signal path allows the undesired target signal 274 to substantially equally couple onto these signal paths.

The matching of these various signal paths allows the undesired target signal 270 and/or the undesired target signal 274 to couple substantially equally onto the first component 354.1 and the second component 354.2 as a common-mode component. As a result, the undesired target signal 270 and/or the undesired target signal 274 may be reduced by simply subtracting the first component 354.1 and the second component 354.2.

CONCLUSION

It is to be appreciated that the Detailed Description section, and not the Abstract section, is intended to be used to interpret the claims. The Abstract section may set forth one or more, but not all exemplary embodiments, of the present disclosure, and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the present disclosure. Thus the present disclosure should not be limited by any of the above-described exemplary embodiments, but should be defined only in accordance with the following claims and their equivalents.

What is claimed is:

1. A communications device, comprising:
   a reference oscillator configured to provide a reference signal that is operating at a reference frequency; and
   a reference phase-locked loop (PLL) configured to:
      receive a power signal,
      provide a target signal that is operating at a target frequency, and
      mix the power signal with the reference signal such that the target signal tracks the reference signal when the communications device is engaged in a communications channel that is operating at a communications channel frequency to adjust a power level of a plurality of spurs coupled to the target signal when the reference frequency is different from the communications channel frequency.

2. The communications device of claim 1, wherein the target frequency is configured to be proportional to the reference frequency.

3. The communications device of claim 2, wherein the reference frequency comprises:
   a center frequency of the communications channel.

4. The communications device of claim 3, wherein the reference signal is configured to fluctuate.

5. The communications device of claim 1, wherein the reference PLL comprises:
   a phase frequency detector (PFD) configured to adjust an impedance of the PFD to adjust a mixing gain generated from mixing the power signal with the reference signal.

6. The communications device of claim 5, wherein the impedance of the PFD comprises:
   a capacitance of the PFD.

7. The communications device of claim 6, wherein the PFD is further configured to minimize the mixing gain generated from the mixing of the power signal with the reference signal and each harmonic of the reference signal by minimizing the capacitance of the PFD to minimize a power level of the plurality of spurs that is coupled onto the target signal.

8. The communications device of claim 5, wherein the impedance of the PFD is adjusted based on a selection of a plurality of active devices for the PFD.

9. The communications device of claim 5, wherein the impedance of the PFD is adjusted by adjusting a power rejection ratio for the PFD.

10. The communications device of claim 5, wherein the PFD is further configured to adjust the mixing gain generated from the mixing of the power signal with the reference signal to adjust the power level of the plurality of spurs.

11. A method, comprising:
receiving a reference signal that is operating at a reference frequency;
receiving a power signal; and
mixing the power signal with the reference signal such that a target signal tracks the reference signal when a communications device is engaged in a communications channel that is operating at a communications channel frequency to adjust a power level of a plurality of spurs coupled to the target signal when the reference frequency is different from the communications channel frequency.

12. The method of claim 11, further comprising:
adjusting an impedance of a phase frequency detector (PFD) to adjust a mixing gain generated from the mixing.

13. The method of claim 11, further comprising:
adjusting a power rejection ratio for a phase frequency detector to adjust a mixing gain generated from the mixing.

14. A communications device, comprising:
a reference oscillator configured to provide a reference signal that is operating at a reference frequency; and
a reference phase-locked loop (PLL) comprising a phase frequency detector (PFD), the PFD being configured to:
receive a power signal,
provide a target signal that is operating at a target frequency, and
mix the power signal with the reference signal such that the target signal tracks the reference signal when the communications device is engaged in a communications channel that is operating at a communications channel frequency to adjust a power level of a plurality of spurs coupled to the target signal when the reference frequency is different from the communications channel frequency.

15. The communications device of claim 14, wherein the PFD comprises:
a plurality of critical nodes configured to provide a mixing location for mixing the power signal with the reference signal; and
a plurality of active devices configured to provide a mixing gain generated from the mixing of the power signal with the reference signal,
wherein the plurality of active devices is further configured to adjust the mixing gain generated from the mixing of the power signal with the reference signal to adjust a power level of a plurality of spurs coupled to a target signal.

16. The communications device of claim 15, wherein the PFD is further configured to adjust an impedance of the PFD to adjust the mixing gain generated from the mixing the power signal with the reference signal.

17. The communications device of claim 16, wherein the PFD is further configured to minimize the mixing gain generated from the mixing of the power signal with the reference signal and each harmonic of the reference signal by minimizing a capacitance of the PFD to minimize the power level of the plurality of spurs coupled to the target signal.

18. The communications device of claim 16, wherein the impedance of the PFD is adjusted based on a selection of the plurality of active devices for the PFD.

19. The communications device of claim 16, wherein the impedance of the PFD is adjusted by adjusting a power rejection ratio for the PFD.

20. The communications device of claim 16, wherein the PFD is further configured to adjust the mixing gain generated from the mixing of the power signal with the reference signal to adjust the power level of the plurality of spurs.

* * * * *